(12) United States Patent
Lee et al.

(10) Patent No.: US 11,031,442 B2
(45) Date of Patent: Jun. 8, 2021

(54) ORGANIC LIGHT EMITTING DISPLAY DEVICE

(71) Applicant: LG DISPLAY CO., LTD., Seoul (KR)

(72) Inventors: Jaesung Lee, Paju-si (KR); Jonghyeok Im, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 120 days.

(21) Appl. No.: 16/218,419

(22) Filed: Dec. 12, 2018

(65) Prior Publication Data

US 2019/0189708 A1  Jun. 20, 2019

(30) Foreign Application Priority Data

Dec. 18, 2017 (KR) .................. 10-2017-0174426

(51) Int. Cl.
| | | |
|---|---|---|
| *H01L 27/32* | (2006.01) | |
| *H01L 51/52* | (2006.01) | |
| *H01L 51/50* | (2006.01) | |
| *G09G 3/3291* | (2016.01) | |
| *G09G 3/3233* | (2016.01) | |

(52) U.S. Cl.
CPC ....... *H01L 27/3232* (2013.01); *G09G 3/3291* (2013.01); *H01L 27/3246* (2013.01); *H01L 27/3276* (2013.01); *H01L 51/5012* (2013.01); *H01L 51/5228* (2013.01); *G09G 3/3233* (2013.01); *G09G 2310/08* (2013.01); *H01L 51/5212* (2013.01)

(58) Field of Classification Search
CPC ............. H01L 27/3232; H01L 27/3276; H01L 27/124; H01L 51/5012; H01L 51/5228; G09G 3/3291

See application file for complete search history.

(56) References Cited

U.S. PATENT DOCUMENTS

| | | | | |
|---|---|---|---|---|
| 2007/0057881 A1* | 3/2007 | Yu | ............................ | G02F 1/133 345/82 |
| 2009/0159890 A1* | 6/2009 | Yamazaki | ........... | H01L 27/3276 257/59 |
| 2014/0183479 A1* | 7/2014 | Park | .................... | H01L 27/3218 257/40 |
| 2019/0355928 A1* | 11/2019 | Narutaki | ........... | G02F 1/133528 |
| 2020/0057330 A1* | 2/2020 | Yamazaki | ............. | H01L 29/786 |

FOREIGN PATENT DOCUMENTS

| KR | 20170038579 A | 4/2017 |
|---|---|---|
| KR | 20170065752 A | 6/2017 |

* cited by examiner

*Primary Examiner* — Tuan A Hoang
(74) *Attorney, Agent, or Firm* — Polsinelli PC

(57) ABSTRACT

The present disclosure includes: a display panel separated into a light emitting unit, in which an organic light emitting diode is disposed, and a light transmitting unit which selectively transmits light; and a driving circuit configured to drive the display panel. The display panel includes a first substrate, a second substrate, and a liquid crystal layer. In the first substrate, the organic light emitting diode is disposed in the light emitting unit, and a first electrode is disposed in the light transmitting unit. The second substrate faces the first substrate, and a second electrode is disposed in the light transmitting unit. The liquid crystal layer is interposed between the first electrode and the second electrode, and adjusts a transmittance due to a difference between a voltage applied to the first electrode and a voltage applied to the second electrode.

18 Claims, 5 Drawing Sheets

ORGANIC LIGHT EMITTING DISPLAY DEVICE

CROSS REFERENCE TO RELATED APPLICATION

This application claims the benefit of Korea Patent Application No. 10-2017-0174426 filed on Dec. 18, 2017, the entire contents of which is incorporated herein by reference for all purposes as if fully set forth herein.

BACKGROUND

Field of the Disclosure

The present disclosure relates to an organic light emitting display device.

Description of the Background

An organic light emitting device among flat panel display devices is a self-luminescent display device that emits light by electrically exciting an organic compound. Since an organic light emitting device does not require a backlight that should be used in a liquid crystal display (LCD) device, a decrease in weight and thickness of the OLED is possible and manufacturing processes can be simplified. Further, the organic light emitting device can be manufactured in a low temperature, has a high response speed of 1 ms or less, and has characteristics such as low power consumption, a wide viewing angle, and a high contrast.

Recently, there are proposed technologies for forming a partial area of a display panel as a transparent part allowing light to passing therethrough so that a display device can be used as a transparent display device. The transparent display device is increasingly used in a wider range of fields, but there is a drawback that a displayed quality of an image on the display device is degraded because the partial area of the display panel allows light to pass through.

SUMMARY

Accordingly, the present disclosure is directed to an organic light emitting display device that substantially obviates one or more of problems due to limitations and disadvantages of the prior art.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

To achieve these and other advantages and in accordance with the purpose of the present disclosure, as embodied and broadly described, an organic light emitting display device including a display panel separated into a light emitting unit, in which an organic light emitting diode is disposed, and a light transmitting unit which selectively transmits light; and a driving circuit configured to drive the display panel. The display panel may include a first substrate, a second substrate, and a liquid crystal layer. In the first substrate, the organic light emitting diode may be disposed in the light emitting unit, and a first electrode may be disposed in the light transmitting unit. The second substrate may face the first substrate, and a second electrode may be disposed in the light transmitting unit. The liquid crystal layer may be interposed between the first electrode and the second electrode, and adjust a transmittance due to a difference between a voltage applied to the first electrode and a voltage applied to the second electrode.

In another aspect of the present disclosure, an organic light emitting display device including a display panel having first and second substrates facing each other where a light emitting unit and a light transmitting unit are defined, comprises an organic light emitting diode disposed on the first substrate and located at the light emitting unit; a driving circuit configured to drive the display panel; first and second electrodes disposed at the light emitting unit and the light transmitting unit, respectively; a bank layer disposed on the first substrate and defining the light emitting unit and the light transmitting unit; and a transmittance tuner interposed between the first and second electrodes and adjusting a transmittance of the light emitting unit in accordance with according to a voltage difference applied to the first and second electrodes.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Figure 1:
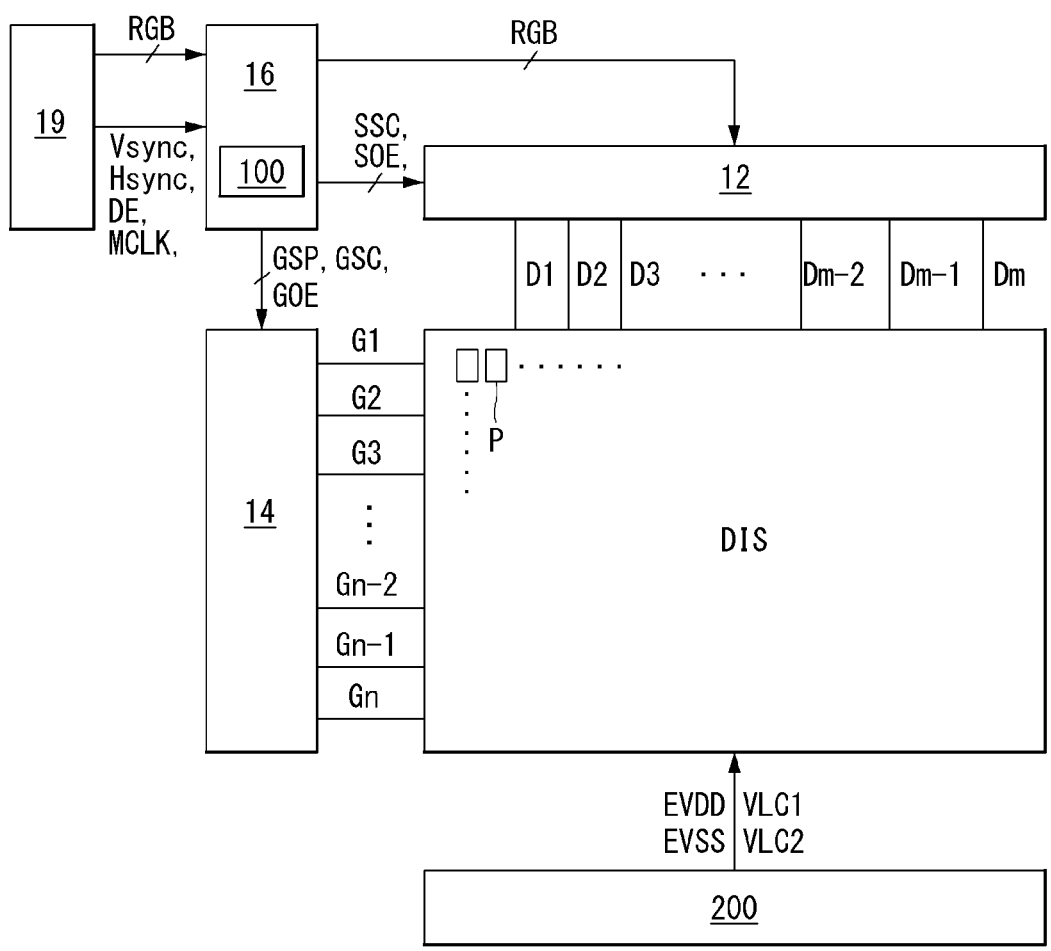
FIG. 1 is a block diagram schematically illustrating an organic light emitting display device.

Hereinafter, exemplary aspects of this disclosure will be described in detail with reference to the accompanying drawings, wherein same reference numerals may be used to denote the same or substantially the same elements throughout the specification and the drawings. In the following description, well-known functions or constructions related to this disclosure are not omitted if they would obscure gist of this disclosure in unnecessary. In describing various exemplary aspects, descriptions of the same or like components will be given in the beginning but omitted in other exemplary aspects.

It will be understood that although the terms first, second, etc. may be used herein to describe various elements, these elements should not be limited by these terms. These terms are generally only used to distinguish one element from another.

Figure 2:
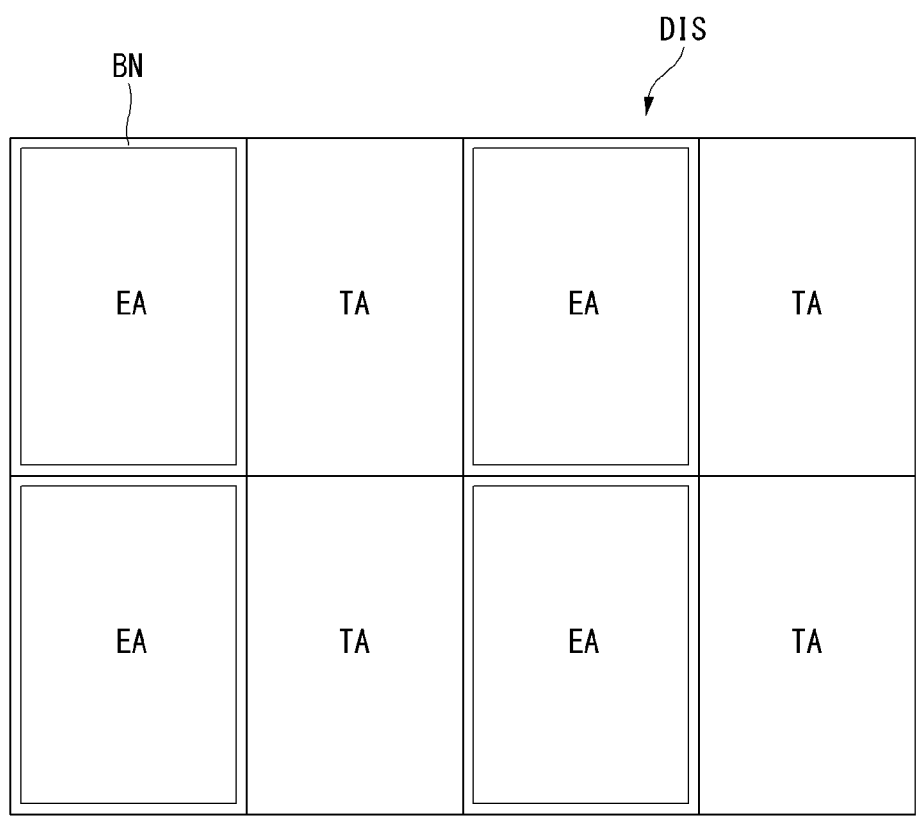
FIG. 2 is a diagram schematically illustrating configuration of a pixel shown in FIG. 1.

FIG. 1 is a block diagram schematically illustrating an organic light emitting display device. FIG. 2 is a diagram schematically illustrating a configuration of a pixel shown in FIG. 1.

Referring to FIG. 1, an organic light emitting display device 10 according to the present disclosure includes a driving circuit and a display panel DIS. The driving circuit includes a data driver 12, a gate driver 14, and a timing controller 16.

The data driver 12 generates an analog data voltage based on digital video data RGB received from the timing controller 16. A data voltage output from the data driver 12 is supplied to data lines D1 to Dm.

The gate driver 14 supplies a gate signal in sync with the data voltage to gate lines G1 to Gn, sequentially, and selects pixels of the display panel DIS into which the data voltage is written.

The timing controller 16 receives a timing signal, such as a vertical synchronization signal Vsync, a horizontal synchronization signal Hsync, a data enable signal DE, and a main clock MCLK, from a host system 19 to synchronize an operation timing of the data driver 12 and an operation timing of the gate driver 14 with each other. A data timing control signal for controlling the data driver 12 includes a source sampling clock SSC, a source output enable signal SOE, etc. A gate timing control signal for controlling the gate driver 14 includes a gate start pulse GSP, a gate shirt clock GSC, a gate output enable signal GOE, etc.

The host system 19 may be implemented as any one of a television system, a set top box, a navigation system, a DVD player, a Blu-ray player, a personal computer (PC), a home theater system, and a phone system. The host system 19 includes a System on Chip (SoC) embedded with a scaler and converts digital video data RGB of a received image to a format suitable to display the received image on the display panel DIS. The host system 19 transmits timing signals Vsync, Hsync, DE, and MCLK in addition to the digital video data to the timing controller 16.

In addition, the timing controller 16 includes a mode controller 100 for controlling mode setting of the display device. The mode controller 10 may drive the display panel DIS in a normal mode or in a transparent mode according to a user's selection. Operation of the display panel DIS according to a driving mode will be described later.

A power unit 200 generates a voltage to be applied to the display panel DIS. The power unit 200 generates a high-potential driving voltage EVDD and a low-potential voltage EVSS to drive pixels. In addition, the power unit 200 generates a second voltage VLC2 to be applied to a second electrode E2 of a light transmitting unit TA.

The display panel DIS includes a pixel array. The pixel array includes pixels which are defined by the data lines D1 to Dm (m is a positive integer) and the gate lines G1 to Gn (n is a positive integer). Each of the pixels includes an organic light emitting diode which is a self-emitting element.

FIG. 2 is a schematic diagram illustrating a flat array of a display panel.

Referring to FIG. 2, the display panel DIS includes a light transmitting unit TA for selectively transmitting light, and a light emitting unit EA for displaying an image.

The light transmitting unit TA may not have a non-transparent metal layer disposed therein in order to transmit light. The light transmitting unit TA may include a light transmission controller for selectively transmitting light according to a driving mode. The light emitting unit EA includes one or more pixels.

Figure 3:
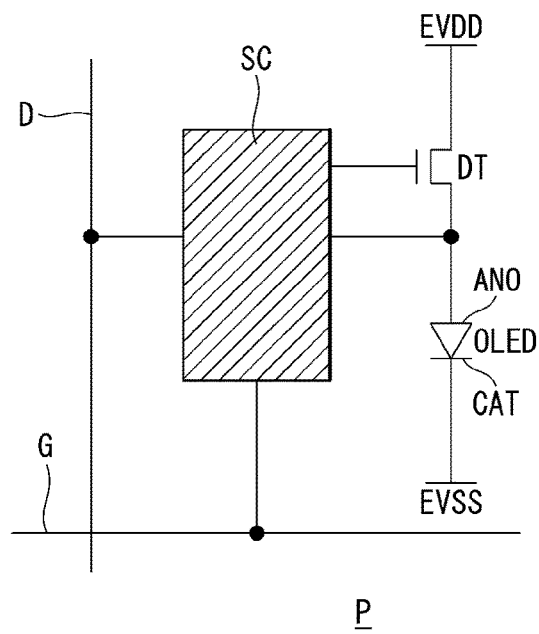
FIG. 3 is a diagram illustrating an example of a pixel disposed in a light emitting unit.

FIG. 3 is a diagram illustrating an example of a pixel disposed in a light emitting unit.

Referring to FIG. 3, a pixel P is connected to a data line D and a gate line G. The pixel P includes an organic light emitting diode OLED, a driving transistor DT for controlling an amount of current flowing through the organic light emitting diode OLED, and a programming unit SC for controlling operation of the driving transistor DT. The programming unit SC is composed of one or more transistors and one or more capacitors, and controls voltages of major nodes such as a gate electrode and a source electrode of the driving transistor DT. For example, in response to a gate pulse applied from the gate line G, the programming unit SC writes a data voltage, received from the data line D, into the programming unit SC. The driving transistor DT supplies a driving current, which is proportional to a size of the data voltage written into the programming unit SC, to the organic light emitting diode OLED. The organic light emitting diode OLED emits light in proportion to a size of the driving current supplied from the driving transistor DT. The organic light emitting diode OLED includes an anode ANO, a cathode CAT, and an organic compound layer interposed between the anode ANO and the cathode CAT. The anode ANO is connected to the driving transistor DT.

Figure 4:
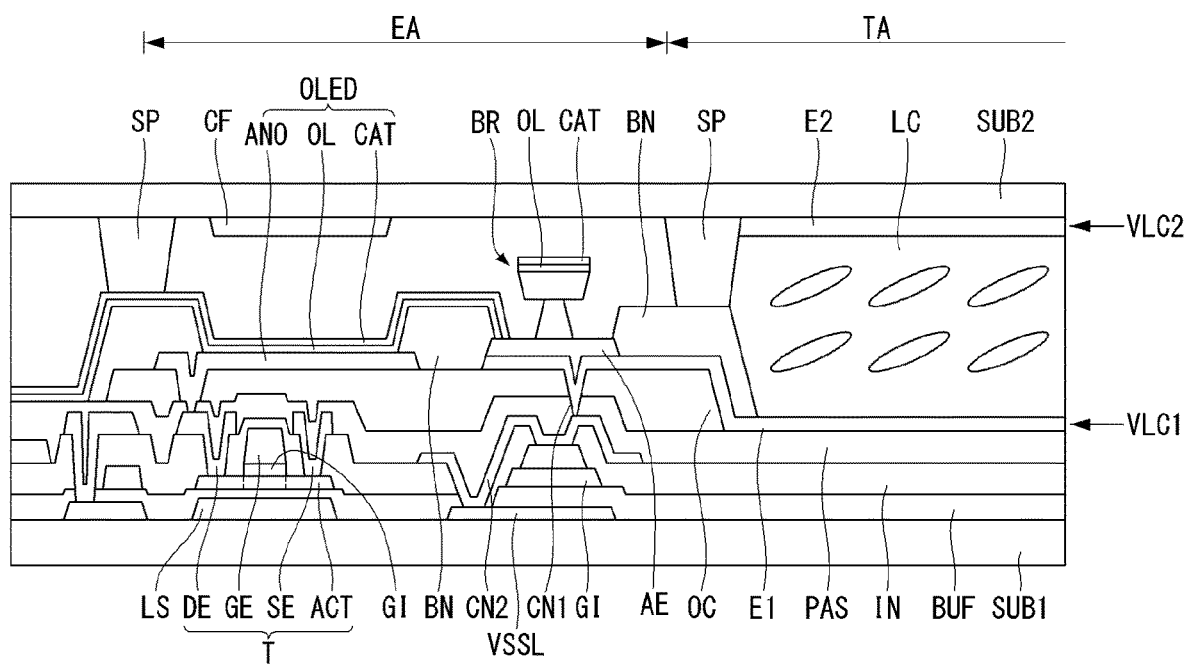
FIG. 4 is a cross-sectional view illustrating an organic light emitting display device according to a first aspect of the present disclosure.

FIG. 4 is a cross-sectional view illustrating an organic light emitting display device according to a first aspect of the present disclosure.

Referring to FIG. 4, the organic light emitting display device according to a first aspect includes A transistor T, a first substrate SUB1 on which an organic light emitting diode OLED is formed, and a second substrate SUB2 on which a color filter CF is formed. A transistor T and the organic light emitting diodes OLED are disposed in a light emitting unit EA, and display an image. A light transmission adjuster E1, E2, and LC is disposed in a light transmitting unit TA.

The first substrate SUB1 may be formed of a glass or plastic material. To have a flexible characteristic, the first substrate SUB1 may be formed of PI (Polyimide), PET (polyethylene terephthalate), PEN (polyethylene naphthalate), PC (polycarbonate), etc.

A light shielding layer LS and a low-potential voltage line VSSL are disposed on the first substrate SUB1. The light shielding layer LS is disposed to overlap a semiconductor layer of the transistor T, especially a channel, on a plane so as to protect an oxide semiconductor element from external light.

A buffer layer BUF is disposed on the first substrate SUB1 to cover the light shielding layer LS and the low-potential voltage line VSSL. The buffer layer BUF prevents ions or any foreign substance from spreading on the first substrate SUB1, and prevents external moisture from permeating into the first substrate SUB1.

A semiconductor layer ACT is disposed on the buffer layer BUF. An insulating layer formed to cover the semiconductor layer ACT is patterned, so a gate insulating layer GI is disposed at a position where a gate electrode GE is to be formed on the buffer layer BUF.

The gate insulating layer GI insulates the gate electrode GE and may be composed of a silicon oxygen layer (SiOx).

The gate electrode GE is disposed on the gate insulating layer GI.

The gate electrode GE is disposed to face the semiconductor layer ACT with the gate insulating layer GI therebetween. The gate electrode GE may be composed of a single layer or multiple layers formed of one of copper (Cu), molybdenum (Mo), aluminum (Al), chrome (Cr), gold (Au), titanium (Ti), nickel (Ni), neodymium (Nd), tantalum (Ta), and tungsten (W), or alloys thereof.

An interlayer insulating layer IN is disposed on the buffer layer BUF to cover the gate electrode GE. The interlayer insulating layer IN insulates the gate electrode GE and a source/drain electrode SE or DE from each other, and may be formed of one of a silicon oxide layer (SiOx), a silicon nitride layer (SiNx), and multiple layers thereof.

The source/drain electrode SE or DE and a second auxiliary connector CN2 are disposed on the interlayer insulating layer IN.

The source electrode SE and the drain electrode DE are spaced a predetermined distance apart from each other. The source electrode SE comes into contact with one side of the semiconductor layer ACT through a source contact hole which penetrates the interlayer insulating layer IN. The drain electrode DE comes into contact the other side of the semiconductor layer ACT through a drain contact hole which penetrates the interlayer insulating layer IN. The source electrode SE and the drain electrode DE may be composed of a single layer or multiple layers. The source electrode SE and the drain electrode DE, if composed of a single layer, may be composed of one of molybdenum (Mo), aluminum (Al), chrome (Cr), gold (Au), titanium (Ti), nickel (Ni), neodymium (Nd), and copper (Cu), or alloys thereof. The source electrode SE and the drain electrode DE, if composed of multiple layers, may be composed of two layers of molybdenum/aluminum-neodymium, molybdenum/aluminum, or titanium/aluminum, or three layers of molybdenum/aluminum-neodymium/molybdenum, molybdenum/aluminum/molybdenum, titanium/aluminum/titanium, or molybdenum titanium/copper/molybdenum titanium.

The second auxiliary connector CN2 penetrates the interlayer insulating layer IN to be connected with the first auxiliary connector CN1. In addition, the second auxiliary connector CN2 penetrates the buffer layer BUF and the interlayer insulating layer IN to be connected with the low-potential voltage line VSSL.

The semiconductor layer ACT, the gate electrode GE, and the source/drain electrode SE or DE forms the transistor T.

A passivation layer PAS is positioned on the transistor T. The passivation layer PAS protects the transistor T, and may be formed of silicon oxide (SiOx), silicon nitride (SiNx), or multiple layers thereof.

A planarization layer OC is positioned on the passivation layer PAS. The planarization layer OC makes irregularities underneath thereof flat, and may be formed of an organic material such as photo acryl, polyimide, benzocyclobutene resin, acrylate resin, etc. If necessary, any one of the passivation layer PAS and the planarization layer OC may be omitted.

An anode ANO, a first electrode E1, and an auxiliary electrode AE are disposed on the planarization layer OC.

The anode ANO is connected with the drain electrode DE of the transistor T through a contact hole which penetrates the passivation layer PAS and the planarization layer OC. The anode ANO may be in a three-layer structure in which a reflective layer is interposed between transparent electrodes. The transparent electrodes may be composed of a transparent metal material of Indium Tin Oxide (ITO) or the like, and the reflective layer may be composed of aluminum (Al), copper (Cu), silver (Ag), nickel (Ni), molybdenum (Mo), molybdenum titanium (MoTi), etc.

The first electrode E1 may be disposed to cover at least the area of the light transmitting unit TA. The first electrode E1 is connected with the low-potential voltage line VSSL through the second auxiliary connector CN2 and the first auxiliary connector CN1 to be supplied with a low-potential voltage EVSS. The first electrode E1 may be formed using a transparent electrode of ITO or the like. In particular, the first electrode E1 may be formed using a lower layer of the anode ANO which is in the three-layer structure. When the first electrode E1 is formed using the three-layer structure of the anode ANO, a method of forming an anode material to cover the light transmitting unit TA and etching a reflective layer and an upper transparent electrode, in which the first electrode E1 is to be disposed, may be used.

The auxiliary electrode AE contacts the cathode CAT, and is connected with the low-potential voltage line VSSL through the first and second auxiliary connectors CN1 and CN2. The auxiliary electrode AE may be formed on a layer identical to a layer on which the anode ANO is disposed, and may be formed of a material identical to a material of the anode ANO. The auxiliary electrode AE is depicted separately to be distinguished from the first electrode E1 in FIG. 4, but, when the first electrode is formed as a lower layer of the anode ANO, the first electrode E1 may be integrally formed with the auxiliary electrode AE.

A bank layer BN for separating a light emitting unit EA of the pixel P is positioned on the first substrate SUB1 on which the anode ANO and the auxiliary electrode AE are formed. The bank layer BN may be formed of an organic material such as polyimide, benzocyclobutene resin, acrylate resin, etc.

The bank layer BN may be disposed to cover a side end of the anode ANO while exposing the center of the anode ANO. It is desirable that the exposed area of the anode ANO is designed at maximum to secure a sufficient aperture ratio. In addition, the bank layer BN may be disposed to cover a side end of the auxiliary electrode AE while exposing the center of the auxiliary electrode AE.

The bank layer BN may not be disposed on the light transmitting unit TA in order to prevent a Yellowish phenomenon in the area of the light transmitting unit TA. The yellowish phenomenon refers to a phenomenon in which faded yellow is displayed due to material properties of the planarization layer OC and the bank layer BN.

A partition BR is positioned on the auxiliary electrode AE. The partition BR physically separates an organic light emitting layer OL and a cathode, each of which will be formed later, from each other. In other words, the organic light emitting layer OL and the cathode CAT may be physically separated by the partition BR from each other on the auxiliary electrode AE and thus discontinued.

The organic light emitting layer OL is positioned on the first substrate SUB1 on which the partition BR is formed. The organic light emitting layer OL may be formed widely on a front surface of the first substrate SUB1.

The organic light emitting layer OL is physically separated on the auxiliary electrode AE by the partition BR. As separated by the partition BR, the organic light emitting layer OL exposes at least part of the auxiliary electrode AE at the periphery of the partition BR. Part of the organic light emitting layer OL separated by the partition BR may be positioned in the upper part of the partition BR.

The cathode CAT is positioned on the organic light emitting layer OL. The cathode CAT may be formed of a transparent conductive material such as Indium Tin Oxide (ITO) and Indium Zinc Oxide (IZO), and may be composed of magnesium (Mg), calcium (Ca), aluminum (Al), silver (Ag), or alloys thereof which have a thickness thin enough to allow light to pass therethrough.

The cathode CAT is physically separated on the auxiliary electrode AE by the partition BR. As separated by the partition BR, the cathode CAT exposes at least part of the auxiliary electrode AE at the periphery of the partition BR. Part of the cathode CAT separated by the partition BR is positioned in the upper part of the partition BR.

The cathode CAT covers the organic light emitting layer OL, and one end thereof comes into direct contact with the auxiliary electrode AE. That is, one end of the cathode CAT exposed as being separated by the partition BR comes into direct contact with an exposed upper surface of the auxiliary electrode AE. This structure may be realized due to a difference in step coverage between a material of the organic light emitting layer OL and a material of the cathode CAT. For example, the cathode CAT may be formed of a transparent conductive material having a higher step coverage than the material of the organic light emitting layer OL, and thus, the cathode CAT may be formed to come into direct contact with the auxiliary electrode AE.

The color filter CF is disposed in the light emitting unit EA of the second substrate SUB2. In addition, the second electrode E2 is disposed in the area of the light transmitting unit TA of the second substrate SUB2.

The first substrate SUB1 and the second substrate SUB2 may be laminated with a spacer SP interposed therebetween to secure a space. A filler may be formed in the area of the light emitting unit EA between the first substrate SUB1 and the second substrate SUB2. A liquid crystal layer LC is disposed in the area of the light transmitting unit TA between the first substrate SUB1 and the second substrate SUB2. The liquid crystal layer LC may be formed in an alignment film (not shown) which is disposed in each of the first electrode E1 and the second electrode E2.

The light transmission adjuster includes the first electrode E1, the second electrode E2, and the liquid crystal layer LC. The light transmission adjuster operates in a normal mode and a light transmission mode under the control of the mode controller 100.

Figure 5:
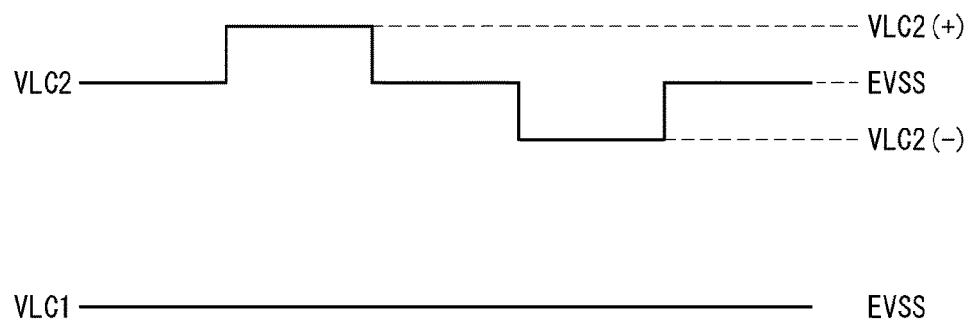
FIG. 5 is a diagram illustrating first and second voltages which controls operation of a light transmission adjuster.

FIG. 5 is a diagram illustrating first and second voltages which controls operation of the light transmission adjuster.

Referring to FIGS. 4 and 5, the first electrode E1 of the light transmission adjuster is supplied with a first voltage VLC1, and the second electrode E2 of the light transmission adjuster is supplied with a second voltage VLC2.

The first voltage VLC1 may be a low-potential voltage EVSS applied from the low-potential voltage line VSSL. The second voltage VLC2 is set to be the low-potential voltage EVSS, a positive second voltage VLC2[+] or a negative second voltage VLC2[−]. A voltage level of the positive second voltage VLC2[+] or the negative second voltage VLC2[−] is set to a voltage level at which a transmittance of the liquid crystal layer LC is maximized or minimized due to a voltage difference from the low-potential voltage EVSS. The second voltage VLC2 may be any one of the positive second voltage VLC2[+], the low-potential voltage EVSS and the negative second voltage VLC2[−], and may be a swing voltage, as shown in FIG. 5.

In a Normally Transparent (NT) mode, a transmittance of the liquid crystal layer LC decreases in proportion to a voltage difference between the first electrode E1 and the second electrode E2. In a Normally Black (NB) mode, a transmittance of the liquid crystal layer LC increases in proportion to a voltage difference between the first electrode E1 and the second electrode E2.

Thus, according to modes of the liquid crystal layer LC and the light transmission controller, the mode controller applies a voltage as shown in the following [Table 2] to the second electrode E2.

TABLE 2

|    | Normal Mode        | Transparent Mode   |
|----|--------------------|--------------------|
| NB | EVSS               | VLC2(+) or VLC2(−) |
| NT | VLC2(+) or VLC2(−) | EVSS               |

Referring to [Table 2], in order to drive the light transmitting unit TA in the normal mode while the liquid crystal layer LC is driven in the NB mode, the mode controller 100 applies the low-potential voltage EVSS to the second electrode E2. As a result, a voltage difference between the first electrode E1 and the second electrode E2 is minimized, and the liquid crystal layer LC shields light. In order to drive the light transmitting unit TA in the transparent mode while the liquid crystal layer LC is driven in the NB mode, the mode controller 100 applies the second voltage VLC2 to the second electrode E2. As a result, a voltage difference between the first electrode E1 and the second electrode E2 is maximized, and a transmittance of the liquid crystal layer LC is maximized.

In order to drive the light transmitting unit TA in the normal mode while the liquid crystal layer LC is driven in the NT mode, the mode controller 100 applies the second voltage VLC2 to the second electrode E2. As a result, a voltage difference between the first electrode E1 and the second electrode E2 is maximized, and the liquid crystal layer LC shields light. In order to drive the light transmitting unit TA in the transparent mode while the liquid crystal layer LC is driven in the NB mode, the mode controller 100 applies the low-potential voltage EVSS to the second electrode E2. As a result, a voltage difference between the first electrode E1 and the second electrode E2 is minimized, and a transmittance of the liquid crystal layer LC is maximized.

As described above, the organic light emitting display device according to the first aspect is capable of selectively adjusting a transmittance of the light transmitting unit TA using the light transmission adjuster which is formed in the light transmitting unit TA. In the normal mode, a transmittance of the light transmitting unit TA may be minimized so as to minimize a minimum amount of light passing through the display device. As a result, the display device 10 displays only an image from the light emitting unit EA, and thus, a user is able to concentrate on the image displayed by the display device itself.

In addition, in the transparent mode, the display device 10 may function as a transparent display by maximizing a transmittance of the light transmitting unit TA.

Figure 6:
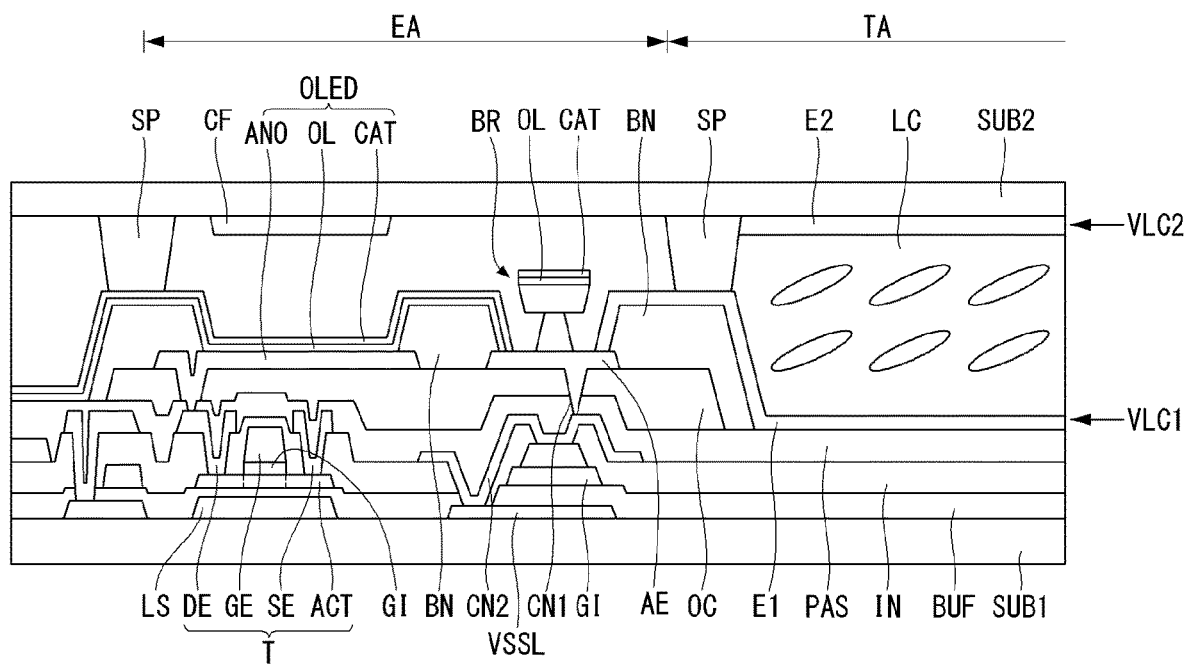
FIG. 6 is a diagram illustrating an organic light emitting display device according to a second aspect of the present disclosure.

FIG. 6 is a diagram illustrating an organic light emitting display device according to a second aspect of the present disclosure. In FIG. 6, detailed description of components similar to or substantially the same as the components of the above exemplary aspect will be omitted.

Referring to FIG. 6, an organic light emitting display device according to the second aspect of the present disclosure includes a transistor T, a first substrate SUB1 on which an organic light emitting diodes OLED is formed, and a second substrate SUB2 on which a color filter CF is formed. The transistor T and the organic light emitting diode OLED are disposed in a light emitting unit EA and display an image. A light transmission adjuster is disposed in a light transmitting unit TA.

A light shielding layer LS and a low-potential voltage line VSSL are disposed in the first substrate SUB1. In addition, a buffer layer BUF is disposed to cover the light shielding layer LS and the low-potential voltage line VSSL. A semiconductor layer ACT is disposed on the buffer layer BUF. By patterning an insulating layer on the buffer layer BUF to cover the semiconductor ACT, a gate insulating layer GI is disposed at a position where a gate electrode GE is to be formed. The gate electrode GE is disposed on the gate insulating layer GI. The gate electrode GE is disposed to face the semiconductor layer ACT with the gate insulating layer GI therebetween. An interlayer insulating layer IN is disposed on the buffer layer BUF to cover the gate electrode GE. A source/drain electrode SE or DE and a second auxiliary connector CN2 are disposed on the interlayer insulating layer IN. The second auxiliary connector CN2 penetrates the interlayer insulating layer IN. In addition, the second auxiliary connector CN2 penetrates the buffer layer BUF and the interlayer insulating layer IN to be connected with the low-potential voltage line VSSL. A passivation layer PAS is positioned on a transistor T. A planarization layer OC is positioned on the passivation layer PAS.

An anode ANO and an auxiliary electrode AE are disposed on the planarization layer OC. A bank layer BN for separating the light emitting unit EA of the pixel P is positioned on the first substrate SUB1 on which the anode ANO and the auxiliary electrode AE are formed. A partition BR is positioned on the auxiliary electrode AE. An organic light emitting layer OL is positioned on the first substrate SUB1 on which the partition BR is formed.

The organic light emitting layer OL is physical separated on the auxiliary electrode AE by the partition BR to expose at least part of the auxiliary electrode AE at the periphery of the partition BR. Part of the organic light emitting layer OL separated by the partition BR is positioned in the upper part of the partition BR.

A cathode CAT is positioned on the organic light emitting layer OL, and a first electrode E1 is positioned on the passivation layer PAS to cover the bank layer BN. The cathode CAT and the first electrode E1 may be formed at the same time using the same metal material. For example, the cathode CAT and the first electrode E1 may be formed using a transparent metal material of ITO or the like.

While formed widely over a front surface of the first substrate SUB1, the cathode CAT and the first electrode E1 may be separated by the partition BR. In addition, one end of the cathode CAT and one end of the first electrode E1 respectively come into direct contact with an upper portion of the auxiliary electrode AE. Thus, the first electrode E1 may be supplied with a low-potential voltage EVSS through the cathode CAT and the low-potential voltage line VSSL.

Figure 7:
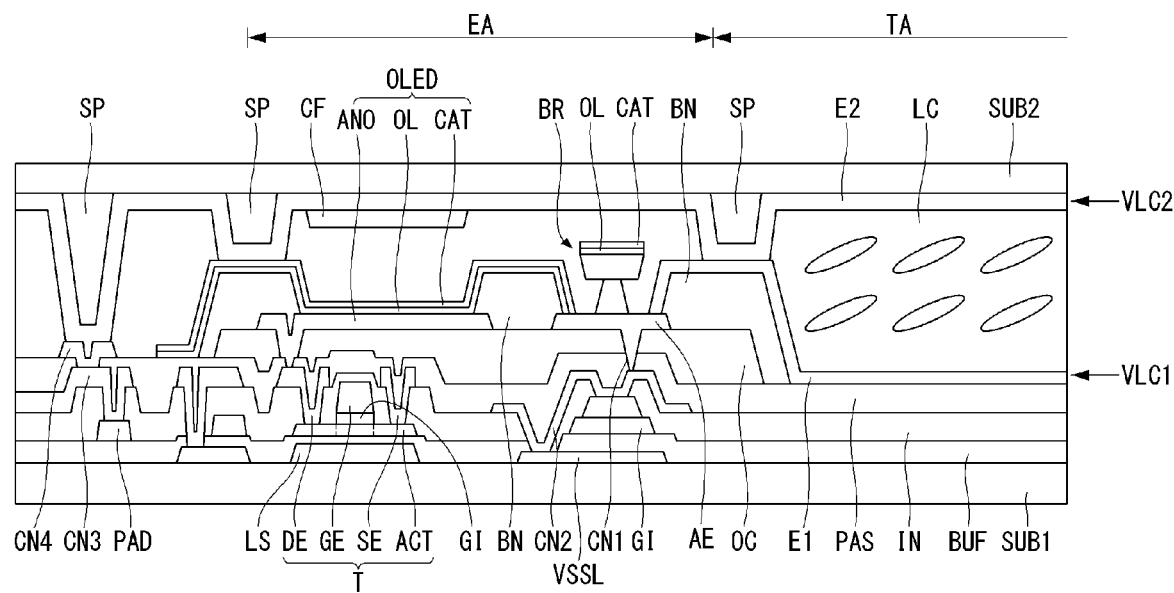
FIG. 7 is a diagram illustrating an organic light emitting display device according to a third aspect of the present disclosure.

FIG. 7 is a diagram illustrating an organic light emitting display device according to a third aspect of the present disclosure. In FIG. 7, detailed description of components similar to or substantially the same as the components of the above exemplary aspects will be omitted.

Referring to FIG. 7, an organic light emitting display device according to the third aspect of the present disclosure includes transistors T, a first substrate SUB1 on which an organic light emitting diodes OLED is formed, and a second substrate SUB2 on which a color filter CF is formed. The transistors T and the organic light emitting diodes OLED are disposed in a light emitting unit EA and display an image. A light transmission adjuster is disposed in a light transmitting unit TA. In the third aspect, a shape of a first electrode E1 formed in the first substrate SUB1 may be any one of a shape of the first electrode E1 in the first aspect and a shape of the first electrode E1 in the second aspect.

A pad PAD is disposed on a buffer layer BUF in a periphery area of the first substrate SUB1.

A first spacer SP1 and a second spacer SP2 are formed in the second substrate SUB2, and a second electrode E2 is formed to cover the first spacer SP1. The second electrode E2 may be formed to cover the entire area of the second substrate SUB2. At the periphery, the second electrode E2 contacts a fourth auxiliary connector CN4 which is formed in the first substrate SUB1. A third auxiliary connector CN3 contacts the pad PAD through the third auxiliary connector CN3. The pad PAD may be supplied with the second voltage VLC2 from a power unit 200. That is, the second electrode E2 may be supplied with a second voltage VLC2 through the pad PAD formed in the first substrate SUB1.

As described above, the present disclosure may selectively control a transmittance of a display device using a light transmission adjuster formed in a transparent area. In particular, the present disclosure may adjust a transmittance without making a display panel thick, by arranging a light transmissive adjuster between substrates of the display panel.

In addition, the present disclosure utilizes materials of an existing transparent display device to form electrodes for controlling a light transmission adjuster, and thus, it is possible to form the light transmission adjuster without an additional process. The present disclosure may selectively control a transparent ratio of a display device using the light transmission adjuster formed in a light transmitting unit. In particular, the present disclosure may adjust a transmittance without making a display panel thick, by arranging the light transmissive adjuster between substrates of the display panel.

In addition, the present disclosure utilizes materials of an existing transparent display device to form electrodes for controlling the light transmission adjuster, and thus, the light transmission adjuster may be formed without an additional process.

The present disclosure may selectively control a transmittance of the display device using a light transmission adjuster formed in a light transmitting unit. In particular, in the present disclosure, the light transmission adjuster is arranged between substrates of a display panel, and thus, it is possible to adjust a transmittance without making the display panel thick.

In addition, the present disclosure utilizes materials of an existing transparent display device to form electrodes for controlling a light transmission adjuster, and thus, it is possible to form the light transmission adjuster without an additional process.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display device comprising:
a display panel divided into a light emitting unit, in which an organic light emitting diode is disposed, and a light transmitting unit which selectively transmits light; and
a driving circuit configured to drive the display panel,
wherein the display panel comprises:
a first substrate where the organic light emitting diode is disposed in the light emitting unit and a first electrode is disposed in the light transmitting unit;
a second substrate facing the first substrate and where a second electrode is disposed in the light transmitting unit;
a liquid crystal layer interposed between the first electrode and the second electrode, and
adjusting a transmittance of the liquid crystal layer according to a difference between a voltage applied to the first electrode and a voltage applied to the second electrode;
a low-potential voltage line disposed on the first substrate;
at least one insulating layer disposed on the low-potential voltage line; and
an auxiliary electrode disposed on the at least one insulating layer contacting the low-potential voltage line through an auxiliary connector passing through the at least one insulating layer,
wherein the auxiliary electrode is in contact with the first electrode and a cathode of the organic light emitting diode.

2. The organic light emitting display device of claim 1, further comprising a bank layer disposed on the first substrate and defining the light emitting unit.

3. The organic light emitting display device of claim 2, wherein the first electrode covers the bank layer and connected to a low-potential voltage line.

4. The organic light emitting display device of claim 1, wherein the first electrode is integrally formed with the auxiliary electrode.

5. The organic light emitting display device of claim 1, wherein the first electrode is formed of a same material as an anode of the organic light emitting diode.

6. The organic light emitting display device of claim 1, wherein the first electrode is formed of a same material as a cathode of the organic light emitting diode.

7. The organic light emitting display device of claim 1, wherein the first electrode is electrically connected to the cathode.

8. The organic light emitting display device of claim 1, further comprising:
a pad disposed on the first substrate and supplied with a second voltage applied from the driving circuit to the second electrode and electrically connected to the second electrode;
at least one insulating layer covering the pad; and
an auxiliary connector passing through the at least one insulating layer.

9. The organic light emitting display device of claim 1, wherein the first and second electrodes are formed of a transparent metal material.

10. An organic light emitting display device including a display panel having first and second substrates facing each other where a light emitting unit and a light transmitting unit are defined, comprising:
an organic light emitting diode disposed on the first substrate and located at the light emitting unit;
a driving circuit configured to drive the display panel;
a first electrode disposed at the light emitting unit and the light transmitting unit, and a second electrode disposed at the light emitting unit and the light transmitting unit;
a bank layer disposed on the first substrate and defining the light emitting unit and the light transmitting unit;
a transmittance tuner interposed between the first and second electrodes and adjusting a transmittance of the light transmitting unit in accordance with according to a voltage difference applied to the first and second electrodes;
a low-potential voltage line disposed on the first substrate;
at least one insulating layer disposed on the low-potential voltage line; and
an auxiliary electrode disposed on the at least one insulating layer contacting the low-potential voltage line through an auxiliary connector passing through the at least one insulating layer,
wherein the auxiliary electrode is in contact with the first electrode and a cathode of the organic light emitting diode.

11. The organic light emitting display device of claim 10, wherein the transmittance tuner includes a liquid crystal layer.

12. The organic light emitting display device of claim 10, wherein the first electrode covers the bank layer and connected to the low-potential voltage line.

13. The organic light emitting display device of claim 10, wherein the first electrode is integrally formed with the auxiliary electrode.

14. The organic light emitting display device of claim 10, wherein the first electrode is formed of a same material as an anode of the organic light emitting diode.

15. The organic light emitting display device of claim 10, wherein the first electrode is formed of a same material as a cathode of the organic light emitting diode.

16. The organic light emitting display device of claim 10, wherein the first electrode is electrically connected to the cathode.

17. The organic light emitting display device of claim 10, further comprising: a pad disposed on the first substrate and supplied with a second voltage applied from the driving circuit to the second electrode and electrically connected to the second electrode;
at least one insulating layer covering the pad; and
an auxiliary connector passing through the at least one insulating layer.

18. The organic light emitting display device of claim 10, wherein the first and second electrodes are formed of a transparent metal material.

* * * * *